(12) United States Patent
Chiu

(10) Patent No.: US 10,483,018 B1
(45) Date of Patent: Nov. 19, 2019

(54) TRANSMISSION CABLE AND POWER SUPPLY DEVICE HAVING TRANSMISSION CABLE

(71) Applicant: Chicony Power Technology Co., Ltd., New Taipei (TW)

(72) Inventor: Huan-Chih Chiu, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/051,843

(22) Filed: Aug. 1, 2018

(30) Foreign Application Priority Data

Jun. 29, 2018 (TW) .............................. 107122694 A

(51) Int. Cl.
| | |
|---|---|
| *G08B 21/00* | (2006.01) |
| *H01B 7/32* | (2006.01) |
| *H02J 7/00* | (2006.01) |
| *G01R 27/26* | (2006.01) |
| *H01R 13/66* | (2006.01) |
| *H01R 13/70* | (2006.01) |
| *H01R 13/717* | (2006.01) |

(52) U.S. Cl.
CPC .............. *H01B 7/32* (2013.01); *G01R 27/26* (2013.01); *H02J 7/0047* (2013.01); *H02J 7/0052* (2013.01); *H01R 13/6691* (2013.01); *H01R 13/70* (2013.01); *H01R 13/717* (2013.01)

(58) Field of Classification Search
CPC ......... H01B 7/32; G01R 27/26; H02J 7/0047; H02J 7/0052

USPC ......................................................... 340/661
See application file for complete search history.

(56) References Cited

U.S. PATENT DOCUMENTS

| | | | |
|---|---|---|---|
| 2005/0260884 A1* | 11/2005 | Yueh .................. | H01R 13/6691 439/488 |
| 2010/0246075 A1* | 9/2010 | Chao ...................... | H02H 9/004 361/56 |
| 2012/0110235 A1* | 5/2012 | Hsieh ...................... | G09B 5/062 710/316 |
| 2015/0123648 A1 | 5/2015 | Picard | |
| 2017/0005500 A1* | 1/2017 | Zhang .................. | H02J 7/0021 |
| 2018/0054072 A1 | 2/2018 | Ishida | |

FOREIGN PATENT DOCUMENTS

| | | |
|---|---|---|
| CN | 103399251 A | 11/2013 |
| CN | 204229625 U | 3/2015 |
| CN | 106796262 A | 5/2017 |

* cited by examiner

*Primary Examiner* — Mark S Rushing
(74) *Attorney, Agent, or Firm* — Innovation Capital Law Group, LLP; Vic Lin

(57) ABSTRACT

A transmission cable includes a cable body, a return control circuit, and a determining circuit. The cable body has a first end and a second end, and the cable body includes a first wire and a second wire. The return control circuit is located at the second end and configured to selectively electrically connect the first wire to the second wire. The determining circuit is located at the first end, and configured to determine an electrical property of the second wire and output a first signal when the foregoing electrical property is less than a threshold.

20 Claims, 5 Drawing Sheets

TRANSMISSION CABLE AND POWER SUPPLY DEVICE HAVING TRANSMISSION CABLE

CROSS-REFERENCE TO RELATED APPLICATION

This non-provisional application claims priority under 35 U.S.C. § 119(a) to Patent Application No. 107122694 filed in Taiwan, R.O.C. on Jun. 29, 2018, the entire contents of which are hereby incorporated by reference.

BACKGROUND

Technical Field

The present invention relates to a device for detecting a transmission cable, and in particular, to a transmission cable and a power supply device having the transmission cable and configured to detect quality of the transmission cable.

Related Art

Generally, a mobile electronic device may need to be recharged due to insufficient power after it is used by a user for a period of time. Charging is the most commonly performed by using a charger. However, a problem of extremely slow (extremely long) charging, device overheating, or incapability of charging may occur during charging. The user may intuitively determine that a power converter or an exception of the mobile device body causes the problem, and may subsequently change or directly change the power converter or the mobile terminal.

In addition, cable aging, twisting, or folding, or poor connection of a transmission cable may be an important reason for causing an exception. Therefore, currently, the user cannot learn whether the problem is caused by a transmission cable body.

The user does not necessarily have related knowledge for determining whether the transmission cable is damaged. Moreover, even if the transmission cable body is damaged, it is difficult to determine by appearance. Internal impedance of the transmission cable may increase or the inner part thereof may crack and therefore have poor connection.

SUMMARY

In view of this, the present invention provides a transmission cable and a power supply device having a transmission cable, applicable to detecting whether impedance of a transmission cable body is normal, and can provide a user with a simple and quick detection manner and device.

In an embodiment, a transmission cable includes a cable body, a return control circuit, and a determining circuit. The cable body has a first end and a second end, and the cable body includes a first wire and a second wire. The return control circuit is located at the second end and is configured to selectively electrically connect the first wire to the second wire. The determining circuit is located at the first end and is configured to determine an electrical property of the second wire and output a first signal when the electrical property is less than a threshold.

In an embodiment, the return control circuit includes a manual switch, and the manual switch selectively electrically connects the first wire to the second wire.

In an embodiment, the return control circuit includes a first switch and a first time delay circuit, and the first switch is configured to selectively electrically connect the first wire to the second wire, where when actuated, the first time delay circuit delays a first time period, and then turns on the first switch to electrically connect the first wire to the second wire.

In an embodiment, the cable body further includes a third wire, the first switch is a transistor, the transistor has a gate, a source, and a drain, the first time delay circuit includes a first resistor and a first capacitor, the drain is electrically connected to the first wire, the source is electrically connected to the second wire, the first resistor has one end electrically connected to the first wire and the other end electrically connected to the gate, and the first capacitor has one end connected to the gate and the other end electrically connected to the third wire.

In an embodiment, the determining circuit includes a comparator, configured to compare a return voltage of the second wire with a threshold voltage and output a voltage level signal when the return voltage is less than the threshold voltage.

In an embodiment, the determining circuit includes a controller and a light-emitting element, where the controller is configured to calculate a voltage difference between an output voltage of the first wire and a return voltage of the second wire and output a voltage level signal when the voltage difference is greater than a preset voltage, and the controller is further configured to selectively actuate the light-emitting element based on the voltage level signal.

In an embodiment, the determining circuit further includes a controller and a light-emitting element, where the controller is configured to selectively actuate the light-emitting element based on the voltage level signal.

In an embodiment, the determining circuit further includes a controller and a buzzer, where the controller is configured to selectively actuate the buzzer based on the voltage level signal.

In an embodiment, an energy saving circuit is further provided, where the energy saving circuit is located at the second end and is configured to: when actuated, delay a second time period, and then turn off the first switch to disconnect the electrical connection between the first wire and the second wire, the second time period being greater than the first time period.

In another embodiment, a power supply device includes a power supply circuit, a cable body and a return control circuit. The power supply circuit is configured to provide a power supply and includes a determining circuit. The cable body has a first end and a second end, the cable body includes a first wire, a second wire, and a third wire, and the power supply circuit provides the power supply to the first end corresponding to the first wire and the third wire. The return control circuit is located at the second end and is configured to selectively electrically connect the first wire to the second wire. The determining circuit is configured to determine an electrical property of the second wire and output a first signal when the electrical property is less than a threshold.

In another embodiment, the return control circuit includes a manual switch, and the manual switch selectively electrically connects the first wire to the second wire.

In another embodiment, the power supply circuit selectively outputs or does not output the power supply according to the first signal.

DETAILED DESCRIPTION

Figure 1:
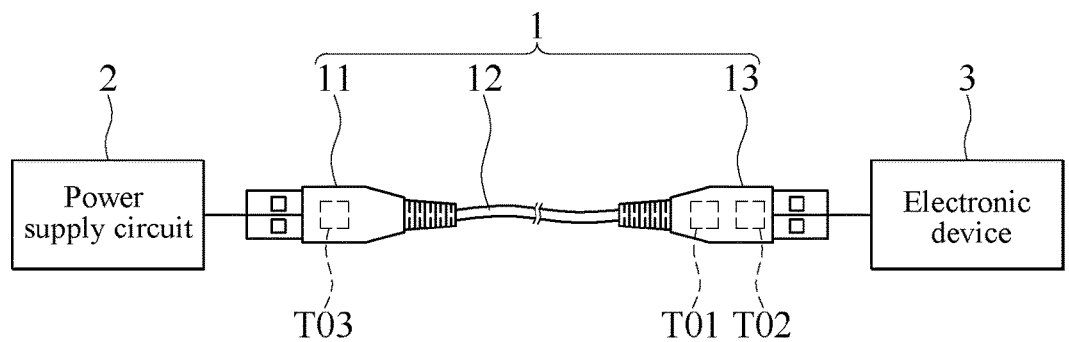
FIG. 1 is a schematic diagram of an embodiment of a transmission cable and an application thereof according to the present invention.

FIG. 1 is a schematic diagram of an embodiment of a transmission cable and an application thereof according to the present invention. As shown in FIG. 1, the transmission cable 1 includes a transmission cable body 12, a return control circuit T01 and a determining circuit T03. The cable body 12 has a first end 11 and a second end 13. One end (that is, the left end in FIG. 1) of the transmission cable 1 is configured to connect to a power supply circuit 2, and the other end (that is, the right end in FIG. 1) of the transmission cable 1 is configured to connect to an electronic device 3. For example, the transmission cable 1 may be configured to connect to a device (for example, a smartphone, a tablet computer, or a smart watch) that needs to be charged by a user, and the other end is connected to a power supply (for example, a mobile power supply, or a battery). When the transmission cable 1 is connected to the power supply circuit 2 and the electronic device 3, the user may clearly know whether the transmission cable body 12 is abnormal by using a detection circuit in the transmission cable 1. Further, the user determines whether the transmission cable body 12 needs to be replaced, instead of considering the electronic device 3 or the power supply circuit 2 as a problem.

Figure 2:
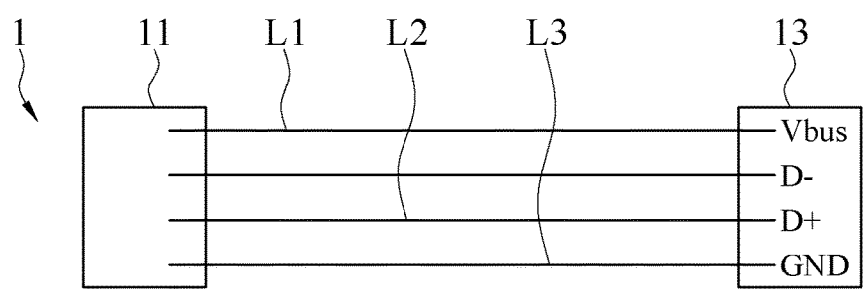
FIG. 2 is a schematic circuit diagram of an embodiment of a cable body of a transmission cable according to the present invention.

FIG. 2 is a schematic circuit diagram of an embodiment of a cable body of a transmission cable according to the present invention. As shown in FIG. 2, the transmission cable 1 has a plurality of wires. In FIG. 2, a USB cable is used as an example. The transmission cable 1 has four wires: a signal wire D+ and a signal wire D− for transferring a signal, a power supply wire Vbus, and a ground wire Ground (GND). The signal wire D+ and the signal wire D− are differential signal pair wires for transmitting USB data. In addition, the power supply wire Vbus and the ground wire GND are configured to supply electric power required by an electronic device.

In some embodiments, for ease of description below, the power supply wire Vbus is defined as a first wire L1, the signal wire D+ is defined as a second wire L2, and the ground wire GND is defined as a third wire L3. In some other embodiments, the signal wire D− may alternatively be defined as a second wire L2, that is, the wire for transferring a signal may also be defined as a second wire L2.

Figure 3:
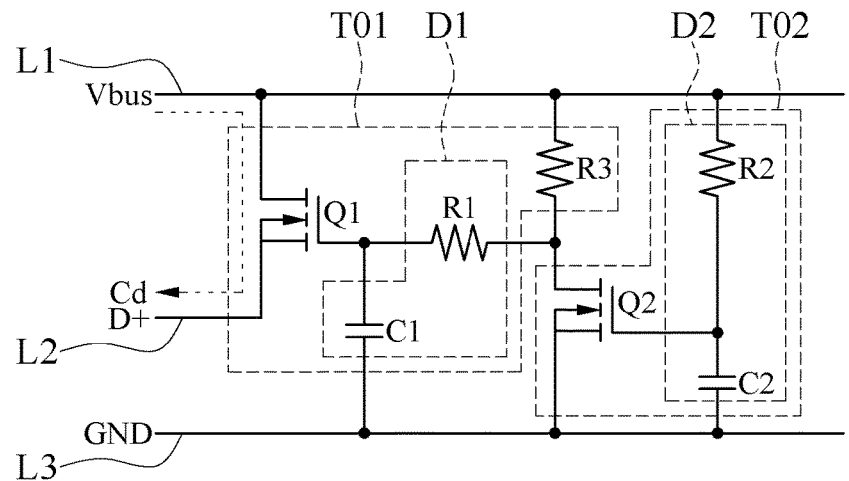
FIG. 3 is a schematic diagram of an embodiment of a return control circuit and an energy saving circuit of a transmission cable according to the present invention.
Figure 4:
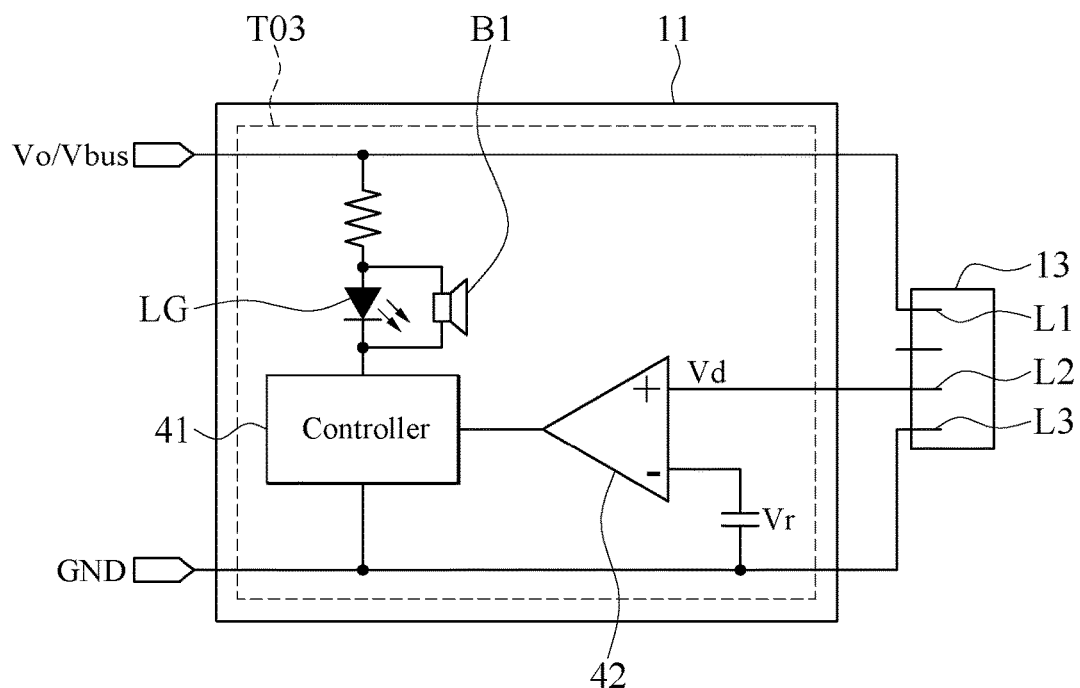
FIG. 4 is a schematic diagram of an embodiment of a determining circuit of a transmission cable according to the present invention.

In some embodiments, referring to FIG. 1, FIG. 3, and FIG. 4, the transmission cable 1 includes the cable body 12, the return control circuit T01, and the determining circuit T03. The return control circuit T01 is located at the second end 13 (that is, the right end in FIG. 1) of the transmission cable 1 and is configured to selectively electrically connect the first wire L1 to the second wire L2 by using a first switch (a transistor Q1). The determining circuit T03 is located at the first end 11 (that is, the left end in FIG. 1) of the transmission cable 1 and is configured to determine an electrical property of the second wire L2. If the electrical property of the second wire L2 is less than a threshold, a first signal is output. Further, an input end of a comparator 42 compares the electrical property of the second wire L2 with a threshold voltage Vr, and the comparator 42 outputs the first signal through an output end of the comparator 42 according to a comparison result, to actuate a controller 41. The return control circuit T01 includes the first switch (the transistor Q1), a first time delay circuit D1, and a resistor R3. The first time delay circuit D1 includes a first resistor R1 and a first capacitor C1. The power supply circuit 2 is connected to the transmission cable 1, and the power supply circuit 2 provides a voltage flowing through the return control circuit T01 through the transmission cable body 12. Referring to FIG. 3, in the return control circuit T01, the transistor Q1 has a gate, a source, and a drain. The drain of the transistor Q1 is electrically connected to the first wire L1, the source is electrically connected to the second wire L2, the gate is electrically connected to one end of the first resistor R1 and one end of the first capacitor C1, and the other end of the first capacitor C1 is connected to the third wire L3. One end of the resistor R3 is connected to the first wire L1, and the other end of the resistor R3 is connected to the other end of the first resistor R1. When a current flows through the resistor R3 and the resistor R1 to the first capacitor C1 through the first wire L1, the current charges the first capacitor C1. After the first capacitor C1 is charged to a threshold voltage for turning on the transistor Q1, the first capacitor C1 enables turning on of the gate of the transistor Q1. When the transistor Q1 is turned on, the current flows through the second wire L2 from the first wire L1 to form a loop (referring to the direction of a dashed line Cd in FIG. 3). Referring to FIG. 4, FIG. 4 is a schematic diagram of an embodiment of a determining circuit of a transmission cable according to the present invention. As shown in FIG. 4, the determining circuit T03 is located at the first end 11 and is electrically connected to the second end 13 by using the first wire L1, the second wire L2, and the third wire L3. When the first wire L1 and the second wire L2 are electrically connected at the second end 13, the power supply circuit 2 supplies a current, passing through the second end 13 of the transmission cable and the return control circuit T01 and flowing back to the determining circuit T03. If the first wire L1 and/or the second wire L2 of the transmission cable cause an increase of impedance because of aging, twisting, or folding of the cable, after the current passes, a corresponding voltage decreases because of this. As shown in FIG. 4, the determining circuit T03 includes the controller 41, the comparator 42, a light-emitting element LG, and a buzzer B1. One end (that is, a pin) of the controller 41 is connected to the output end of the comparator 42, another end of the controller 41 is connected to the light-emitting element LG, and another end of the controller 41 is connected to the third wire L3 (that is, GND). The comparator 42 is configured to compare an electrical property (that is, a return voltage Vd) of the second wire L2 with magnitude of the threshold voltage Vr.

In some embodiments, the determining circuit T03 includes the controller 41, the comparator 42, and the light-emitting element LG. In some other embodiments, the determining circuit T03 includes the controller 41, the comparator 42, and the buzzer B1.

In some embodiments, the transmission cable 1 includes the cable body 12, the return control circuit T01, and the determining circuit T03. In some other embodiments, the transmission cable 1 includes the cable body 12, the return control circuit T01, the determining circuit T03, and the energy saving circuit T02.

In some embodiments, when the return voltage Vd of the second wire L2 is less than the threshold voltage Vr, it indicates that impedance of the transmission cable 1 is abnormal and the cable is aged. The output end of the comparator 42 outputs a voltage level signal to the controller 41. The voltage level signal triggers the controller 41, and the controller 41 actuates the light-emitting element LG after being triggered. The light-emitting element LG lights up to remind a user that the aged transmission cable should be replaced.

In some other embodiments, when the return voltage Vd of the second wire L2 is greater than or equal to the threshold voltage Vr, it indicates that impedance of the transmission cable 1 is normal. The output end of the comparator 42 outputs a voltage level signal to the controller 41, and the voltage level signal indicates normal impedance. When receiving the voltage level signal indicating normal impedance, the controller 41 does not turn on the light-emitting element LG, that is, the light-emitting element LG does not light up.

In some other embodiments, referring to FIG. 4, in the determining circuit T03, the light-emitting element LG is connected to the controller 41, and the light-emitting element LG may be replaced with the buzzer B1. When impedance of the transmission cable 1 is abnormal, the controller 41 actuates the buzzer B1 after being triggered, and the buzzer B1 reminds the user by using a buzz. In another embodiment, the light-emitting element LG of the determining circuit T03 may alternatively be replaced with a vibration element. For example, the vibration element may be but is not limited to a motor. When the controller 41 receives the voltage level signal indicating abnormal impedance, the controller 41 sends a signal to drive the motor to generate vibration, so as to remind the user.

In some embodiments, referring to FIG. 3, when the power supply circuit 2 is initially connected to the transmission cable 1, a power supply voltage may be unstable or a pulse conflict wave may be generated, causing incorrect determining of the return control circuit T01 of the transmission cable 1. Therefore, the transmission cable 1 may include the first time delay circuit D1, the first time delay circuit D1 includes the first resistor R1 and the first capacitor C1, and the first time delay circuit is configured to generate a first time period. After the transmission cable 1 is connected to the power supply circuit 2 and is supplied with a power supply for a period of time, the first capacitor C1 is charged to the threshold voltage for turning on the transistor Q1, and then the gate of the transistor Q1 is turned on. Such a design may also prevent the return control circuit T01 from generating an incorrect determining action.

In some embodiments, still referring to FIG. 3, considering that the return control circuit T01 continuously detects impedance of the transmission cable 1, the energy saving circuit T02 is designed to cooperate with the return control circuit T01 to reduce power consumption. Referring to the right half of FIG. 3, the energy saving circuit T02 is located at the second end 13 and includes a second switch (a transistor Q2) and a second time delay circuit D2. The second time delay circuit D2 includes a second resistor R2 and a second capacitor C2, and the second time delay circuit D2 is configured to generate a second time period. The transistor Q2 has a gate, a source, and a drain. The drain of the transistor Q2 is electrically connected to the first wire L1 by using the resistor R3, and the source is electrically connected to the third wire L3. The second resistor R2 has one end electrically connected to the first wire L1 and the other end electrically connected to the gate. The second capacitor C2 has one end electrically connected to the gate and the other end electrically connected to the third wire L3.

After the transistor Q1 is turned on, a voltage supplied by the power supply circuit 2 enters the second resistor R2 and the second capacitor C2 of the energy saving circuit T02 through the first wire L1. After being charged to the threshold voltage for turning on the transistor Q2, the second capacitor C2 turns on the gate of the transistor Q2. The transistor Q1 is disabled when the transistor Q2 is turned on. That the transistor Q1 is disabled means that the electrical connection between the first wire L1 and the second wire L2 is disconnected. After the electrical connection between the first wire L1 and the second wire L2 is disconnected, a current passes through the loop of the energy saving circuit T02 instead. Broadly, the transistor has a property of conducting the current and therefore may be considered as a switch. In other words, when the transistor Q2 is turned on, the transistor Q1 is turned off. In the circuit design, a product time of the second resistor R2 and the second capacitor C2 is greater than a product time of the first resistor R1 and the first capacitor C1. In other words, the second time period of the second time delay circuit D2 is greater than the first time period of the first time delay circuit D1.

Figure 5:
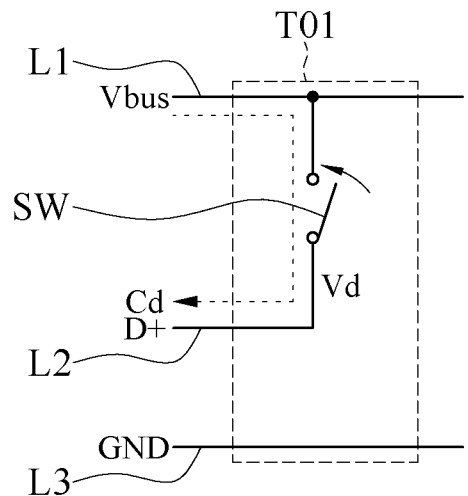
FIG. 5 is a schematic diagram of another embodiment of a return control circuit of a transmission cable according to the present invention.

In some embodiments, referring to FIG. 5, the transistor Q1 of the return control circuit T01 may be replaced with a manual switch (SW). The first resistor R1 and the first capacitor C1 in the first time delay circuit D1 are removed. In other words, the first wire L1 and the second wire L2 are electrically connected only when a user presses the manual switch SW. After the first wire L1 and the second wire L2 are electrically connected, the determining circuit T03 compares the electrical property (that is, the return voltage Vd) of the second wire L2 with the threshold voltage Vr. In other words, the determining circuit T03 estimates whether impedance of the transmission line body is normal by comparing the return voltage Vd with the threshold voltage Vr. The determining circuit T03 may remind the user in the following manner: the light-emitting element LG lights up, the buzzer B1 makes a sound, the vibration element vibrates, or the like. In this case, the user may turn off the manual switch SW. Such a circuit design has an advantage of being conveniently and simply practiced.

Figure 6:
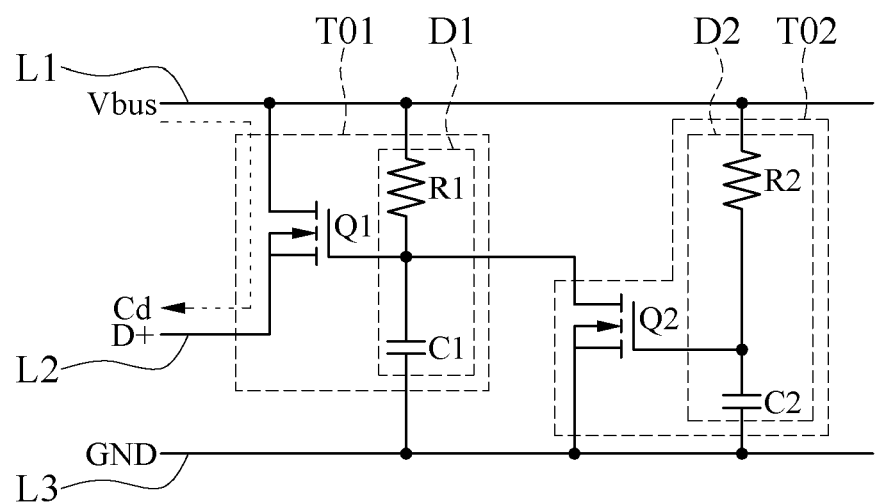
FIG. 6 is a schematic diagram of another embodiment of a return control circuit and an energy saving circuit of a transmission cable according to the present invention.

In some other embodiments, FIG. 6 is a schematic diagram of another embodiment of a return control circuit and an energy saving circuit of a transmission cable according to the present invention. Referring to the left half of FIG. 6, the return control circuit T01 includes a first switch (a transistor Q1) and a first time delay circuit D1. The first time delay circuit D1 includes a first resistor R1 and a first capacitor C1. The transistor Q1 has a drain electrically connected to a first wire L1 and a source electrically connected to a second wire L2. The first resistor R1 has an end electrically connected to the first wire L1 and the other end electrically connected to the gate. The first capacitor C1 has an end electrically connected to the gate and the other end electrically connected to a third wire L3. A difference between FIG. 6 and FIG. 3 lies in that the resistor R3 is removed, so that a design of the return control circuit T01 is simplified. That is, some other implementation aspects of the return control circuit T01 are further provided. Referring to the right half of FIG. 6, an energy saving circuit T02 is also appropriately adjusted, and a drain of a transistor Q2 is electrically connected between the first resistor R1 and the first capacitor C1 to form a node. For remaining parts, refer to the foregoing paragraphs of the energy saving circuit T02. Details are not described herein. The schematic diagram of the embodiment shown in FIG. 6 intends to provide a changeable circuit diagram of the return control circuit T01 and the energy saving circuit T02. For operation manners and functions thereof, refer to the foregoing descriptions. Details are not described herein.

Figure 9:
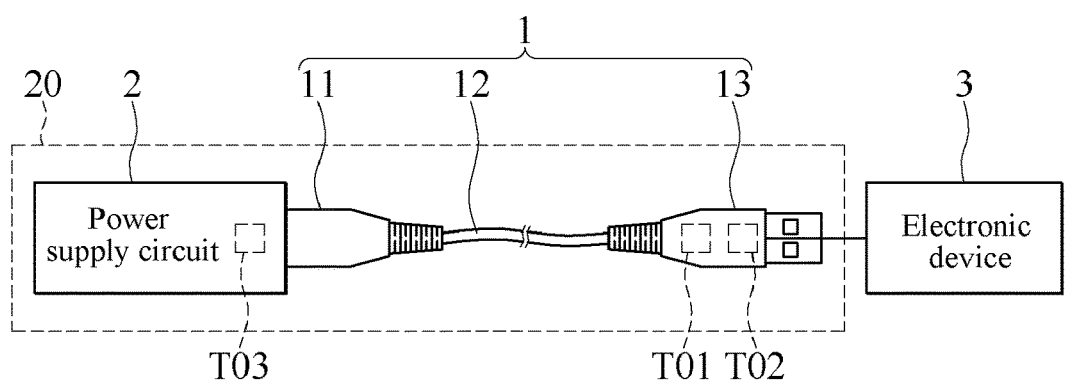
FIG. 9 is a schematic diagram of an embodiment of a power supply device having a transmission cable according to the present invention.

In some other embodiments, FIG. 9 is a schematic diagram of an embodiment of a power supply device having a transmission cable according to the present invention. Referring to FIG. 9, FIG. 3 and FIG. 4, the power supply device 20 includes a power supply circuit 2, a cable body 12 and a return control circuit T01. The power supply circuit 2 is configured to provide a power supply and includes a determining circuit T03. The cable body has a first end 11 and a second end 13, and the cable body includes the foregoing first wire L1, second wire L2 and third wire L3. For the definition of wires of the transmission cable 1, refer to the descriptions in the foregoing paragraphs. Details are not described herein. As shown in FIG. 9, the return control circuit T01 is located at the second end 13 of the transmission cable and is configured to selectively electrically connect the first wire L1 to the second wire L2 (referring to the left half of FIG. 3). The determining circuit T03 is configured to determine an electrical property (that is, a return voltage Vd) of the second wire L2 and output a first signal when the return voltage Vd is less than a threshold (that is, a threshold voltage Vr). A circuit structure and a connection relationship of the return control circuit T01, the energy saving circuit T02 and the determining circuit T03 are similar to those in the foregoing descriptions. For the circuit structure and the connection relationship, refer to related circuit description paragraphs. Details are not described herein.

In some embodiments, refer to FIG. 9, FIG. 3 and FIG. 4. As shown in FIG. 9, the determining circuit T03 is disposed at the side of the power supply circuit 2. The power supply circuit 2 includes the determining circuit T03, and this is different from the foregoing paragraph in which the determining circuit T03 is disposed at the first end 11. A design difference lies in that the power supply circuit 2 can selectively output or does not output the power supply based on the first signal output by the controller 41 of the determining circuit T03. In other words, the first signal of an output end of the comparator 42 is used for controlling a power supply output state of the power supply circuit 2. For example, when the return voltage Vd is less than the threshold voltage Vr, it indicates that impedance of the transmission cable 1 is abnormal and the cable is already aged. In some embodiments, the controller 41 sends, based on the first signal, a signal for instructing not to output the power supply, and uses a feedback circuit of the power supply circuit 2 to enable a pulse width modulation (PWM) control chip to turn off the power supply. On the contrary, when the return voltage Vd is greater than or equal to the threshold voltage Vr, it indicates that impedance of the transmission cable 1 is normal. The controller 41 sends, based on the first signal, a signal for still outputting the power supply.

In some embodiments, referring to FIG. 9, the transistor Q1 of the return control circuit T01 in the power supply device 20 may be replaced with a manual switch SW. The first wire L1 and the second wire L2 are electrically connected only when a user presses the manual switch SW. When the user turns off the manual switch SW, the first wire L1 and the second wire L2 are not electrically connected. The user may detect an impedance status of the transmission cable 1 at any time by pressing the manual switch SW. For the setting objective that is the same as that in the description in the foregoing paragraphs, refer to related circuit description paragraphs. Details are not described herein.

Figure 7:
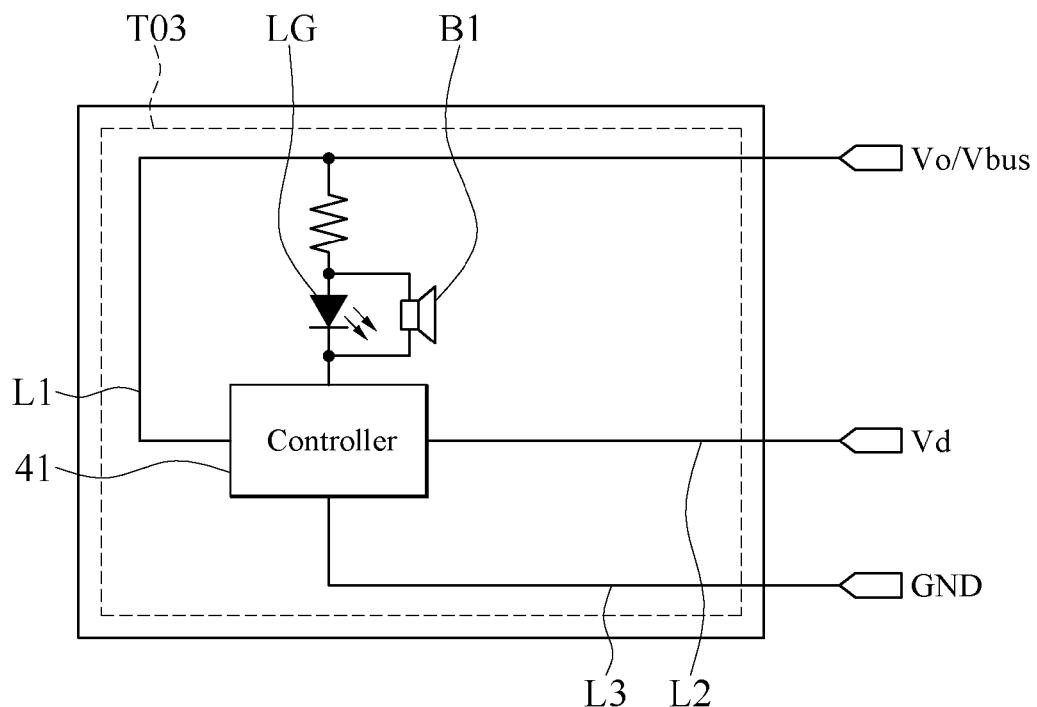
FIG. 7 is a schematic diagram of an embodiment of a determining circuit of a transmission cable according to the present invention.

In some other embodiments, referring to FIG. 7, the determining circuit T03 implements the function thereof by using another implementation aspect. A pin of the controller 41 receives a voltage Vbus from the first wire L1, and compares the voltage Vbus with the return voltage Vd of the second wire L2. In some embodiments, when a voltage difference between the voltage Vbus and the return voltage Vd is greater than a preset value, it indicates that impedance of the transmission cable 1 is abnormal and the cable is already aged. When the controller 41 obtains the comparison difference, the controller 41 actuates the light-emitting element LG, and the light-emitting element LG lights up to remind the user. In some other embodiments, when the voltage difference between the voltage Vbus and the return voltage Vd is less than or equal to the preset value, it indicates that the impedance of the transmission cable 1 is normal. In this case, the controller 41 does not actuate the light-emitting element LG, that is, the light-emitting element LG does not light up.

Figure 8:
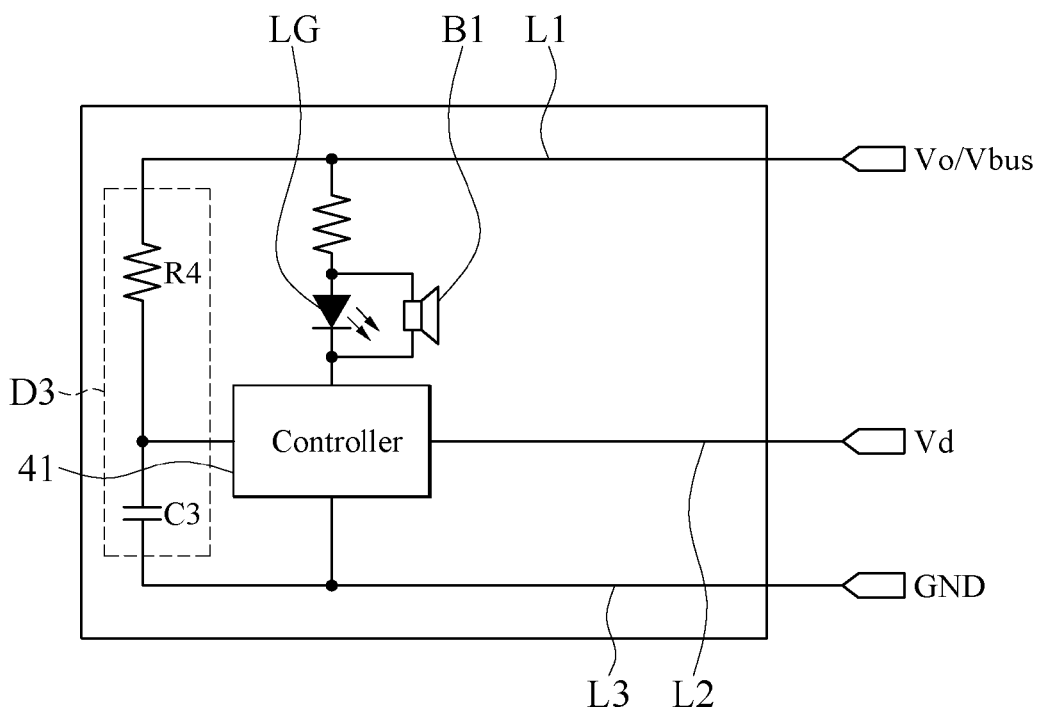
FIG. 8 is a schematic diagram of another embodiment of a determining circuit of a transmission cable according to the present invention.

In some other embodiments, referring to FIG. 8, the determining circuit T03 implements the function thereof by using another implementation aspect. The determining circuit T03 further includes a third time delay circuit D3. The third time delay circuit D3 includes a third resistor R4 and a third capacitor C3, where the third time delay circuit D3 is configured to generate a third time period. A pin of the controller 41 is connected to the second wire L2, another pin of the controller 41 is connected to the light-emitting element LG, and still another pin of the controller is connected to the third wire L3. The third resistor R4 has one end electrically connected to the first wire L1 and the other end electrically connected to the controller 41. The third capacitor C3 has one end electrically connected to the controller 41 and the other end electrically connected to the third wire L3. The determining circuit T03 further includes the third time delay circuit D3, to wait for turning on (that is, after the first wire L1 and the second wire L2 are electrically connected) of the transistor Q1 of the return control circuit T01, so that the controller 41 compares the voltage Vbus of the first wire L1 with the return voltage Vd of the second wire L2. Therefore, in a circuit design, a product time of the third resistor R4 and the third capacitor C3 is greater than a product time of the first resistor R1 and the first capacitor C1. Further, considering a time period of the second time delay circuit D2 of the energy saving circuit T02, the product time of the third resistor R4 and the third capacitor C3 is less than a product time of the second resistor R2 and the second capacitor C2. In other words, a third time period of the third time delay circuit D3 is less than a second time period of the second time delay circuit D2, and the third time period of the third time delay circuit D3 is greater than the first time period of the first time delay circuit D1.

In some other embodiments, the transistor Q1 and the transistor Q2 each may be a metal-oxide-semiconductor field-effect transistor (MOSFET). More clearly, the transistor Q1 and the transistor Q2 may be N-MOSFETs in an embodiment.

In some other embodiments, the threshold voltage Vr may be set to a value obtained by subtracting 15% of an output voltage value Vo from the output voltage value Vo. The threshold voltage Vr satisfies the following formula: Vr=Vo−Vo*15%. For example, if the output voltage value Vo is 5 V or 12 V, the threshold voltage Vr is respectively 4.25 V or 10.2 V. In some other embodiments, in addition to the foregoing manner of setting the threshold voltage Vr, the threshold voltage Vr may be further appropriately adjusted based on a length of the cable.

In some embodiments, a voltage difference between the voltage Vbus and the return voltage Vd is compared with a preset value. The preset value may be set to a percentage of the foregoing voltage difference. When the voltage difference between the voltage Vbus and the return voltage Vd is greater than a set percentage of the voltage difference, it indicates that impedance of the transmission cable is abnormal.

In some embodiments, the determining circuit T03 is configured to determine an electrical property of the second wire L2. In the embodiment in FIG. 4, the determining circuit T03 is configured to determine a voltage of the second wire L2. In some embodiments, the determining circuit T03 is configured to determine a current of the second wire L2. Referring to FIG. 7, a pin that is connected to the second wire L2 and that is of the controller 41 in FIG. 7 may be a current detection pin, configured to detect a current value returned from Vbus and through the second wire L2. The controller 41 can determine a sum of impedance of the first wire L1 and the second wire L2 based on the current value, thereby learning whether a cable is damaged or aged. A current detection unit may be built in or included in the controller 41. The current detection unit is configured to detect a current of the second wire L2. The controller 41 selectively actuates the light-emitting element LG based on the foregoing current. Therefore, the determining circuit T03 may be configured to determine a voltage or a current of the second wire L2. The foregoing embodiment is only an exemplary description, and is not intended to limit the present invention.

The present invention provides a transmission cable and a power supply device having a transmission cable, applicable to detecting an impedance status of the transmission cable. A user does not need to use an additional external device or instrument, and can learn, before charging an electronic device, whether the transmission cable is aged and needs to be replaced. Whether a transmission cable body is normal can be quickly and conveniently determined by using a transmission cable detection device.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A transmission cable, comprising:
   a cable body, having a first end and a second end, the cable body comprising a power supply wire and a signal wire;
   a return control circuit, located at the second end, and configured to selectively electrically connect the power supply wire to the signal wire; and
   a determining circuit, located at the first end, and configured to determine a return voltage of the signal wire and output a first signal when the return voltage is less than a threshold.

2. The transmission cable according to claim 1, wherein the return control circuit comprises a manual switch, and the manual switch selectively electrically connects the power supply wire to the signal wire.

3. The transmission cable according to claim 1, wherein the return control circuit comprises a first switch and a first time delay circuit, and the first switch is configured to selectively electrically connect the power supply wire to the signal wire, wherein when the first time delay circuit is actuated, the first time delay circuit delays a first time period, and then turns on the first switch to electrically connect the power supply wire to the signal wire.

4. The transmission cable according to claim 3, wherein the cable body further comprises a ground wire, the first switch is a transistor, the transistor has a gate, a source, and a drain, the first time delay circuit comprises a first resistor and a first capacitor, the drain is electrically connected to the power supply wire, the source is electrically connected to the signal wire, the first resistor has one end electrically connected to the power supply wire and the other end electrically connected to the gate, and the first capacitor has one end electrically connected to the gate and the other end electrically connected to the ground wire.

5. The transmission cable according to claim 4, wherein the determining circuit comprises a comparator, configured to compare a return voltage of the signal wire with a threshold voltage and output a voltage level signal when the return voltage is less than the threshold voltage.

6. The transmission cable according to claim 5, wherein the determining circuit further comprises a controller and a light-emitting element, wherein the controller is configured to selectively actuate the light-emitting element based on the voltage level signal.

7. The transmission cable according to claim 6, further comprising an energy saving circuit, wherein the energy saving circuit is located at the second end and is configured to: when actuated, delays a second time period, and then turn off the first switch to disconnect the electrical connection between the power supply wire and the signal wire, the second time period being greater than the first time period.

8. The transmission cable according to claim 5, wherein the determining circuit further comprises a controller and a buzzer, wherein the controller is configured to selectively actuate the buzzer based on the voltage level signal.

9. The transmission cable according to claim 8, further comprising an energy saving circuit comprising a second switch and a second time delay circuit, wherein the second switch is configured to selectively turn off the first switch, and when the second time delay circuit is actuated, the second time delay circuit delays the second time period, and then actuates the second switch to turn off the first switch.

10. The transmission cable according to claim 4, wherein the determining circuit comprises a controller and a light-emitting element, wherein the controller is configured to calculate a voltage difference between an output voltage of the power supply wire and a return voltage of the signal wire and output a voltage level signal when the voltage difference is greater than a preset voltage, and the controller is further configured to selectively actuate the light-emitting element based on the voltage level signal.

11. A power supply device, comprising:
a power supply circuit, configured to provide a power supply and comprising a determining circuit;
a cable body, having a first end and a second end, the cable body comprising a power supply wire, a signal wire, and a ground wire, and the power supply circuit providing the power supply to the first end corresponding to the power supply wire and the ground wire; and
a return control circuit, located at the second end, and configured to selectively electrically connect the power supply wire to the signal wire, wherein
the determining circuit is configured to determine a return voltage of the signal wire and output a first signal when the return voltage is less than a threshold.

12. The power supply device according to claim 11, wherein the return control circuit comprises a manual switch, and the manual switch selectively electrically connects the power supply wire to the signal wire.

13. The power supply device according to claim 11, wherein the return control circuit comprises a first switch and a first time delay circuit, wherein the first switch is configured to selectively electrically connect the power supply wire to the signal wire, and when the first time delay circuit is actuated, the first time delay circuit delays a first time period, and then turns on the first switch to electrically connect the power supply wire to the signal wire.

14. The power supply device according to claim 13, wherein the first switch is a transistor, the transistor has a gate, a source, and a drain, the first time delay circuit comprises a first resistor and a first capacitor, the drain is electrically connected to the power supply wire, the source is electrically connected to the signal wire, the first resistor has one end electrically connected to the power supply wire and the other end electrically connected to the gate, and the first capacitor has one end electrically connected to the gate and the other end electrically connected to the ground wire.

15. The power supply device according to claim 14, wherein the determining circuit comprises a controller and a light-emitting element, wherein the controller is configured to calculate a voltage difference between an output voltage of the power supply wire and a return voltage of the signal wire and output a voltage level signal when the voltage difference is greater than a preset voltage, and the controller is further configured to selectively actuate the light-emitting element based on the voltage level signal.

16. The power supply device according to claim 14, wherein the determining circuit comprises a comparator, configured to compare a return voltage of the signal wire with a threshold voltage and output a voltage level signal when the return voltage is less than the threshold voltage.

17. The power supply device according to claim 16, wherein the determining circuit further comprises a controller and a light-emitting element, wherein the controller is configured to selectively actuate the light-emitting element based on the voltage level signal.

18. The power supply device according to claim 17, further comprising an energy saving circuit, wherein the energy saving circuit is located at the second end and is configured to: when actuated, delays a second time period, and then turn off the first switch to disconnect the electrical connection between the power supply wire and the signal wire, the second time period being greater than the first time period.

19. The power supply device according to claim 18, wherein the energy saving circuit comprises a second switch and a second time delay circuit, wherein the second switch is configured to selectively turn off the first switch, and when the second time delay circuit is actuated, the second time delay circuit delays the second time period, and then turns off the first switch.

20. The power supply device according to claim 11, wherein the power supply circuit selectively outputs or does not output the power supply according to the first signal.

* * * * *